United States Patent
Shepard

Patent Number: 5,729,043
Date of Patent: Mar. 17, 1998

[54] SHALLOW TRENCH ISOLATION WITH SELF ALIGNED PSG LAYER

[75] Inventor: Joseph F. Shepard, Hopewell Junction, N.Y.

[73] Assignee: International Business Machines Corporation, Armonk, N.Y.

[21] Appl. No.: 729,559

[22] Filed: Oct. 11, 1996

Related U.S. Application Data

[62] Division of Ser. No. 457,084, Jun. 1, 1995, Pat. No. 5,616, 513.

[51] Int. Cl.$^6$ .............. H01L 29/76; H01L 29/00; H01L 23/58
[52] U.S. Cl. .............. 257/519; 257/368; 257/372; 257/374; 257/396; 257/398; 257/399; 257/400; 257/506; 257/509; 257/510; 257/519; 257/525; 257/647
[58] Field of Search .............. 257/396, 506, 257/509, 510, 525, 647, 374, 398, 399, 400, 519, 368, 382

[56] References Cited

U.S. PATENT DOCUMENTS

| | | | |
|---|---|---|---|
| 4,571,819 | 2/1986 | Rogers et al. | 29/576 |
| 4,656,497 | 4/1987 | Rogers et al. | 257/397 |
| 4,679,308 | 7/1987 | Finn et al. | 29/576 B |
| 4,740,480 | 4/1988 | Ooka | 437/61 |
| 5,059,550 | 10/1991 | Tateoka et al. | 257/506 |
| 5,099,304 | 3/1992 | Takemura et al. | 257/647 |
| 5,362,669 | 11/1994 | Boyd et al. | 437/67 |
| 5,581,110 | 12/1996 | Razouk et al. | 257/513 |

OTHER PUBLICATIONS

S. M. Sze, "Physics of Semiconductor Devices" 2nd edition, John Wiley & Sons, 1981, pp. 372–396.

Primary Examiner—Mahshid D. Saadat
Assistant Examiner—Ida M. Soward
Attorney, Agent, or Firm—Kris V. Srikrishnan

[57] ABSTRACT

A method for forming trench isolation and in specific shallow trench isolation(STI) using $SiO_2$ plugs is proposed. The $SiO_2$ plugs of the STI have a buried phosphorus (P) rich layer introduced during and subsequent to the trench formation to tie up any sodium ionic contamination from processes prior to gate formation. P impurity layer is formed below the surface of the deposited $SiO_2$ layer. A preferred method for forming the buried P layer is by shallow implantation in a vertical direction into the deposited $SiO_2$ layer prior to planarization. The process is self aligned to the trench isolation regions.

5 Claims, 5 Drawing Sheets

SHALLOW TRENCH ISOLATION WITH SELF ALIGNED PSG LAYER

This is a divisional U.S. patent application Ser. No. 08/457,084 filed on Jun. 1, 1995, now U.S. Pat. No. 5,616,513.

FIELD OF INVENTION

The present invention relates generally to semiconductor manufacturing and in particular to forming an improved trench isolation.

BACKGROUND OF THE INVENTION

Isolation is an important and integral part of semiconductor device design and manufacturing. Isolation performs the important function of preventing the unwanted electrical coupling between adjacent parts of a transistor and between transistors. Sub-surface isolation in semiconductor devices are commonly achieved through p-n junctions and through insulating physical regions. Among the dielectric isolation processes, the most common are local oxidation of silicon (LOCOS) (sometimes referred to as recessed oxide (ROX) or Semi-recessed oxide (SROX)), shallow trench isolation (STI) and Deep Trench isolation (DTI). The resulting structure from LOCOS, ROX or SROX will be simply called recessed oxide isolation (ROI) in this text which is different from trench isolation.

FIG. 1A shows a prior art Field Effect Transistor (FET) device using an ROI isolation. In an ROI process, silicon substrate 10 is covered with a silicon nitride (SIN) mask layer and openings in the SiN mask layer correspond to the isolation pattern are defined (not shown). The exposed silicon surfaces are oxidized in a furnace, which results in $SiO_2$ growth into and above the initial silicon surface, thereby forming a body of $SiO_2$ 20 above and below the surface of the substrate. The region covered by SiN is subsequently used to form a gate 50 and source/drain 60 regions. In ROI, the lateral and vertical dimensions of the oxide regions are determined by the oxidation mechanism, viz., diffusion and oxide growth. Usually the horizontal dimensions are large as compared to what is achievable in a trench type isolation. FIG. 1B shows the same structure shown in FIG. 1A, except the ROI has been replaced by trench isolation 30,40. In trench isolation, physical grooves are etched into a Si substrate and the grooves are filled with an insulating material such as silicon dioxide ($SiO_2$). Trench isolation is an effective way to decouple lateral and vertical dimensions of the isolation. As shown in FIG. 1B, a shallow trench isolation 30, isolates adjacent device regions, source and drains 60 of adjacent FET devices within a well region 70, and a deep trench isolation 40 is used sometimes as a capacitor for storage. In forming a STI (or a DTI), the insulator fill process is selected as one that can fill a high aspect ratio trench satisfactorily without voids. This is a key consideration in selecting the lateral and vertical dimension of the trench isolation. This ability to independently shrink the horizontal isolation dimension, makes STI attractive for applications requiring high circuit density, an important objective in semiconductor design and manufacturing. As devices shrink, the depth of source and drain regions become shallow to increase the switching speed of the transistor. Correspondingly, the shallow trench regions also become shallow and narrow, which requires careful combination of unique etch, fill and clean processes.

A major concern in semiconductor processing, especially in CMOS devices, is mobile ionic impurities, such as sodium (Na), which can migrate to gate oxide regions and cause device performance to degrade. Further the migration of sodium ions to the bottom or sides of STI can lower field threshold and cause parasitic channelling. Mobile ions move rapidly, especially under voltage bias and cause gate instability. In semiconductor processing, photoresists, furnaces and wet chemicals are all known potential sources of Na impurities. A great deal of precaution is usually taken in process and materials to avoid introduction of the impurities. In addition, diffusion barrier layers and gettering layers are used to prevent any of the mobile ions from getting to the gate regions. A common practice is to deposit a layer of silicon nitride over gate regions as an impermeable layer to keep Na ions from reaching the gate region. Sometimes phosphosilicate glass (PSG) layers are used in contact with the gate region to actively getter any Na ions. The PSG forms a silicate with Na, thereby chemically ties up the Na ion. PSG layer, and SiN are effective in preventing Na impurities introduced in silicon processing subsequent to gate/formation and effective in protecting the device from Na ions introduced from subsequent processes. However, PSG layers are usually not effective if mobile ions are present under metal or nitride layers. This is the case with STI isolation, thus requiring a gettering layer built into the substrate.

Further, shallow trench isolation is formed prior to forming of the device regions. Current state of the art shallow trench isolation process can introduce mobile ion impurities from a multitude of processes such as groove patterning, etching, filling and planarizing steps. Therefore, there is a clear need to develop a process that will provide immunity to devices from Na ions introduced prior to device formation, a process that should be easily integrated with existing device processes and compatible with subsequent processes.

OBJECTS OF THE INVENTION

An object of the present invention is to provide for a process to minimize the concern of mobile ions in silicon device processing.

A further object of the present invention is to provide such a process prior to device fabrication.

Another object of the present invention is to integrate such a process with shallow trench isolation.

SUMMARY OF THE INVENTION

A method for forming trench isolation and in specific shallow trench isolation(STI) using $SiO_2$ plugs is proposed. The $SiO_2$ plugs of the STI have a buried phosphorus (P) rich layer introduced during and subsequent to the trench formation to tie up any sodium ionic contamination from processes prior to gate formation. P impurity layer is formed beneath the surface the deposited $SiO_2$ layer. A preferred method for forming the buried P layer is by shallow implantation in a vertical direction into the deposited $SiO_2$ layer prior to planarization. The process is self-aligned to the trench regions.

BRIEF DESCRIPTION OF THE DRAWINGS

The objects, features and advantages of the invention will be apparent from the following more particular description of the invention illustrated in the accompanying drawings, in which.

DETAILED DESCRIPTION OF THE INVENTION

Figure 1A:
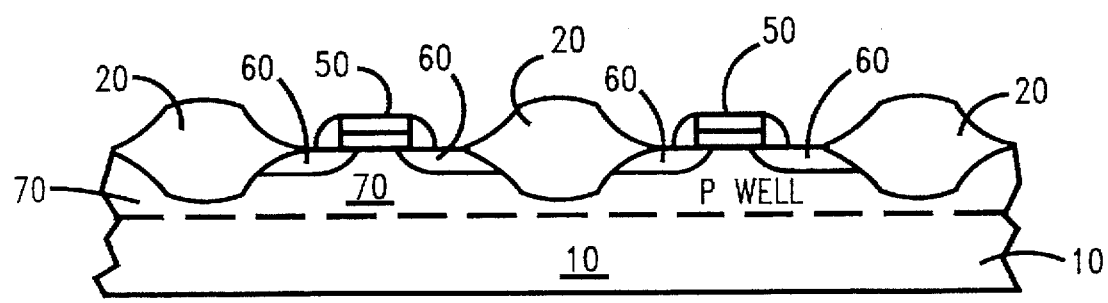
FIG. 1A and FIG. 1B illustrate a prior art silicon device containing ROI and STI respectively.
Figure 1B:
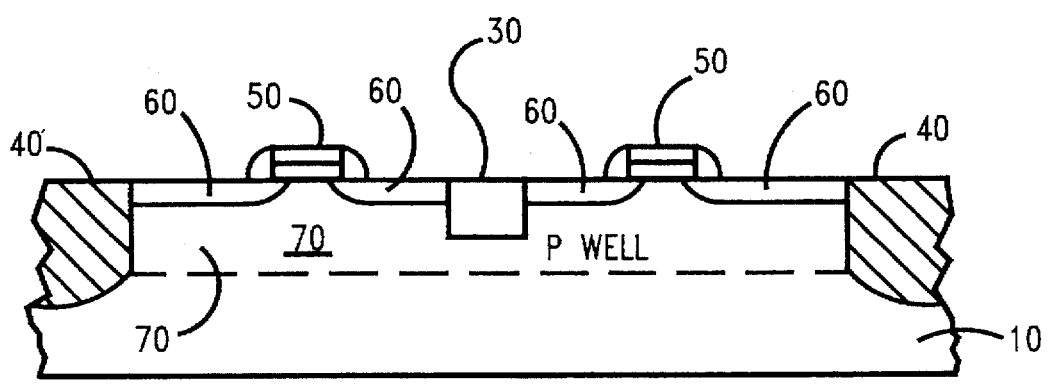
Figure 2A:
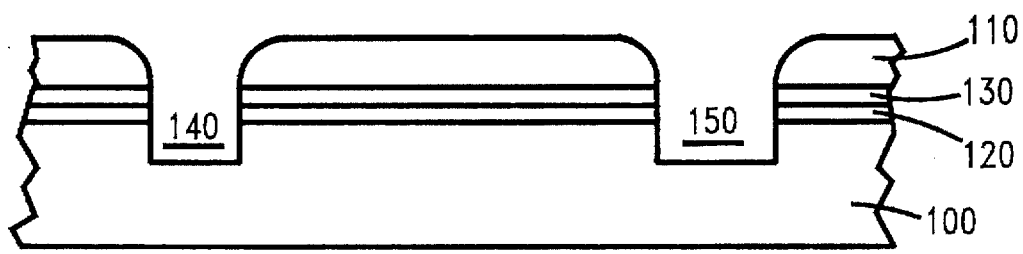
FIGS. 2A–2C shows a sequence of processes used to build a shallow trench isolation.
Figure 2B:
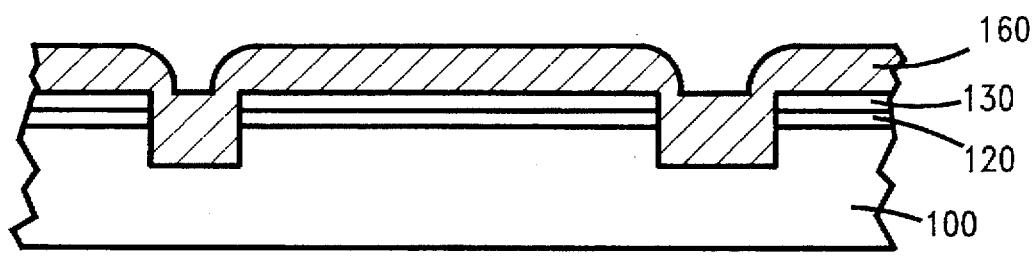
Figure 2C:
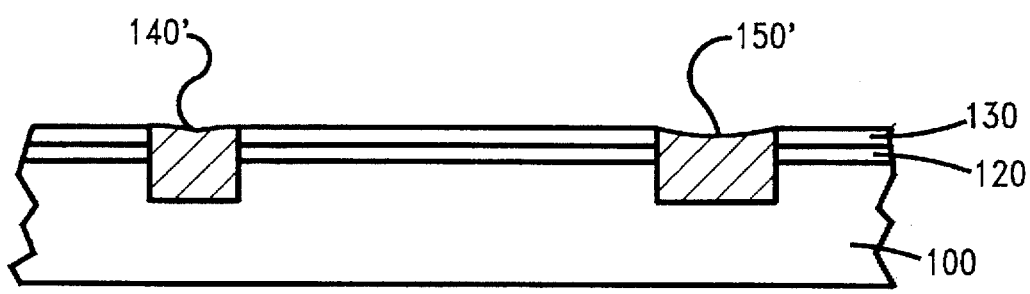

A typical process sequence used to build a shallow trench isolation can be understood using FIGS. 2A–2C. FIG. 2A shows a substrate 100, a composite of an oxide layer 120 and a silicon nitride layer 130, overlying and in contact with the Si substrate. A resist mask 110 is patterned to define areas of STI. The Si is etched to form a variety of trenches or grooves, both narrow grooves 140 and wider grooves 150. As shown in FIG. 2B, the trenches are overfilled with an insulating $SiO_2$ layer 160, usually deposited by a chemical vapor deposition (CVD) using tetra ethyl orthosilicate (TEOS) precursors. Other precursors such as silane ($SiH_4$) or other processes such as plasma enhanced CVD (PECVD) can also be used. The TEOS process generally provides a good conformal deposition. The excess TEOS oxide material is removed preferably by chemical mechanical polish (CMP) such as taught in U.S. Pat. No. 5,362,669 or similar methods. The planarization can also be achieved by sacrificial etch back, using planarizing sacrificial coatings of resists and other organic materials. At the end of planarization, the structure shown in FIG. 2C results in a nearly flush oxide plugs 140' and 150' in substrate 100. Depending on the relative widths of STI regions and the depth or aspect ratio of the grooves, different process problems have to be solved. One problem in planarizing of the excess oxide in the fabrication of the STI, is the introduction of mobile ions such as Na and potassium (K) ions from the slurries, brush and wet clean processes used in CMP.

When photoresist processes are used, mobile ions from resist processes become a source of concern, especially when resist etch back is used to planarize the trench fill material. Sometimes, the photolithographic process associated with trench etching (RIE) such as ashing and cleaning of resist after trench RIE can leave mobile impurities. A suitable discussion on mobile ion migration and how it causes voltage threshold shift in field effect transistors can be found in most text books (e.g. S. M. Sze, Physics of Semiconductors, 2nd edition, Wiley 1981, pp 372–396).

Figure 3:
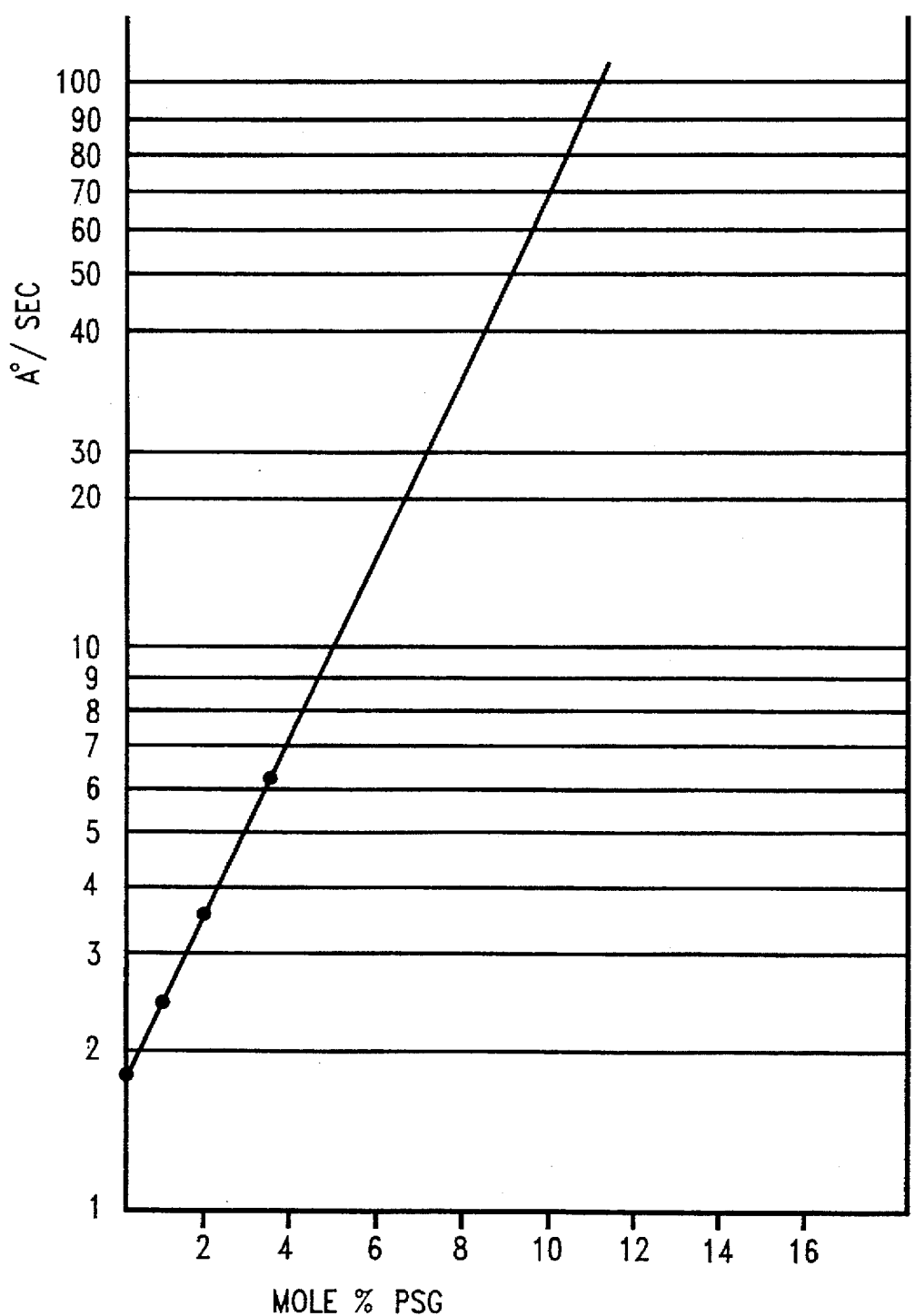
FIG. 3 is a plot of etch rate of P doped glass in a P-etch solution.

The present invention has recognized that it is desirable and preferred to form a buried P containing layer within the STI to actively tie up any mobile impurities. The present invention has also recognized that it is undesirable to form such a P doped glass layer of any thickness at the surface of the STI, as the surface of the STI is exposed to many chemical etches. The concern is that P doped glass layers etch at a very high rate thereby causing local depressions at the STI location. This concern is even more if the entire STI is formed using P doped glass. A minimum of two weight percent phosphorus concentration is required (2 weight percent equivalent of $P_2O_5$ in $SiO_2$) in the doped layer, for the doped layer to effectively getter mobile ions. As shown in FIG. 3, the etch rate in a p-etch (dilute $HF/HNO_3$ mixture) of P doped glass of varying concentration increases sharply as compared to non doped $SiO_2$. The process of gate and sidewall formation involves dipping in dilute HF solution for brief periods of time, which tend to recess a trench filled with undoped oxide by hundreds of angstroms. Such a recess will become unacceptably large if phosphorus doped oxide is used and exposed to the wet etchants. For example, from FIG. 3 it can be seen that even at 2 percent P, the PSG layer etches at a rate two times that of an undoped glass in a p-etch solution. At 4% P, the etch rate becomes 4 times that of undoped oxide. If PSG were used entirely or exposed as a finite layer to the wet etch, it is likely that the entire isolation plug can be etched out, or severe topography can be created, unintentionally but with severe consequences. For example, U.S. Pat. No. 4,740,480 teaches the use of BPSG for a trench fill application, which is not acceptable for STI application, where the trench depth is only 3–5 KA. Therefore, it is extremely important that the P doped layer is formed below the surface of STI. U.S. Pat. No. 4,679,308 teaches the use of implantation to load a dielectric or resist layer with P, which is used to neutralize Na ions from ashing the resist. The dielectric layer of U.S. Pat. No. 4,679,308 is planar and covers the entire wafer surface, unlike STI regions which are recessed and have a specific pattern. The present invention forms a buried layer of P concentration and limits the exposure of the P rich region at the surface of the STI and thus minimizes or avoids altogether the issue of topography generation by PSG etching. The invented process described herein, further forms the P doped layer below the surface and closer to the trench sidewall and bottom in a self-aligned manner.

Figure 4A:
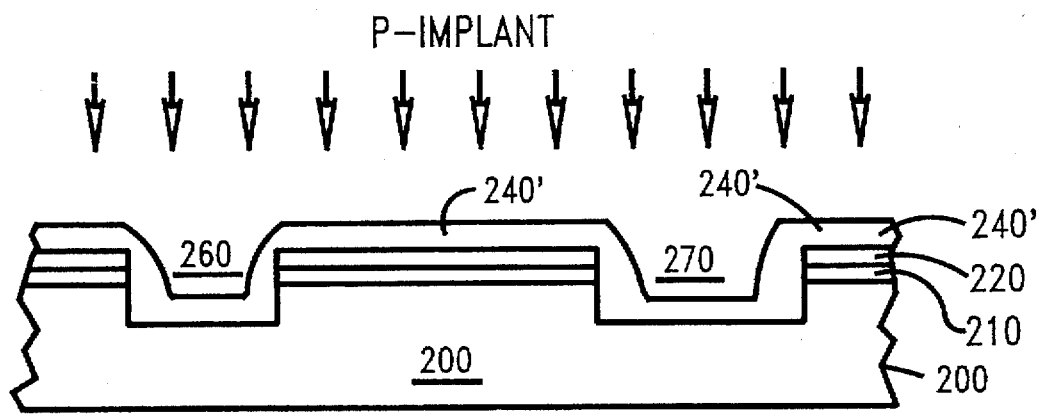
FIGS. 4A–4C shows a sequence of process steps used in an embodiment of the present invention.
Figure 4B:
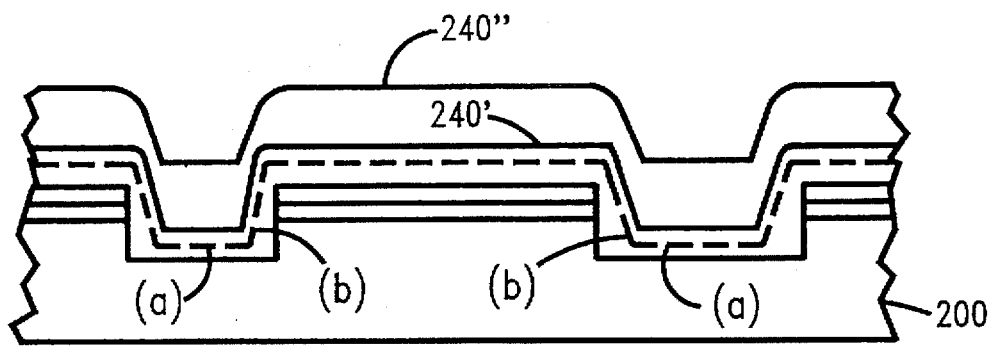
Figure 4C:
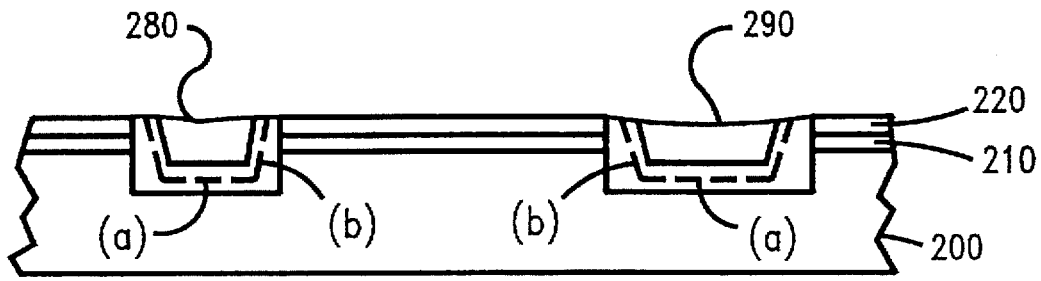

FIGS. 4A–4C illustrate an example of process steps used to implement the present invention. FIG. 4A shows a substrate 200, with trenches 270 and 260 etched vertically into substrate 200 using a resist mask (not shown) and layers of thin $SiO_2$ 210 and SiN 220. The resist mask has been removed (not shown) and a partial thickness of $SiO_2$ 240' deposited over the substrate and into the trench in a conformal manner. It is preferable to use a CVD process that is based on an organo silane precursor such as TEOS. Other processes such as CVD using silane, PECVD or physical deposition processes such as sputtering can also be used. It is preferable that the deposition process is compatible with silicon manufacturing. A suitable thickness for this partial layer 5–40 percent of the trench depth or width, whichever is the smaller dimension, but it will become apparent from subsequent discussions that any reasonable fraction of total thickness can be used and the desired final result can be obtained. FIG. 4A also shows that phosphorus is implanted into the $SiO_2$ layer 240' in a near vertical direction so as to form peak concentration just below the top surface. The implanted layer is shown in FIG. 4B as made of a near horizontal line (a) and a near vertical line (b) parts. The $SiO_2$ deposition is continued to form layer 240" so as to completely fill the trench 270 and 260 and the resulting profile appears as shown in FIG. 4B. For trench depths in the range of 3 KA to 5 KA, a dose of 1–5 E15/cm2 phosphorus can be used. For 1000 of the first layer, an implant voltage of 5–30 KeV can be used. For a thickness of the first layer 240' of about 2000A, an implant voltage of 5–80 KeV can be used. The selection of the implant voltage determines the depth of the maximum concentration. For other thickness and other impurities, the choice of implant condition can be readily calculated or obtained. The $SiO_2$ deposition is continued to form layer 240" so as to completely fill the trench 270 and 260 and the resulting P concentration peak profile appears as shown in FIG. 4B. FIG. 4C shows the resulting structure after a planarizing step to remove the $SiO_2$ material outside of the trench region. The implanted P dopant concentration profile has two parts as earlier discussed, a near horizontal part (a) that is buried inside the trench, and a part (b) that is nearly vertical and extends up to the STI surface 280, 290. The average concentration of phosphorus along (a) is essentially the implant flux density. However, the concentration along (b) is significantly reduced by the slope of line (b). One can estimate the concentration of P along (b) approximately as being the product of concentration of (a) times the cosine of the angle of the sidewall. If the sidewall is close to 90 degrees, the average concentration in (b) will be zero. If it is 60 degrees, it will be half that of (a). Thus, by this technique, even if some of the implanted P region is exposed to the polished STI surface, the P concentration of the exposed region is kept very low. This minimizes considerably the concern of (b) region being etched by subsequent wet etchants and creating recesses. Thus, the final STI shown in FIG. 4C has been formed including a buried P doped layer in a self-aligned manner without use of any masks.

Figure 5A:
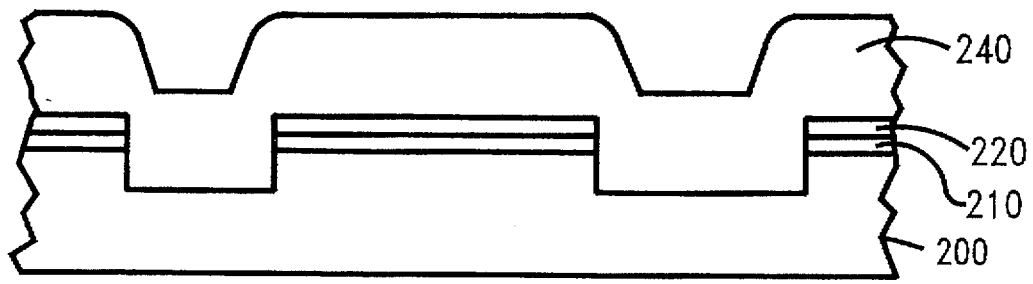
FIGS. 5A–5C shows a sequence of process steps used in an alternate embodiment of the present invention.
Figure 5B:
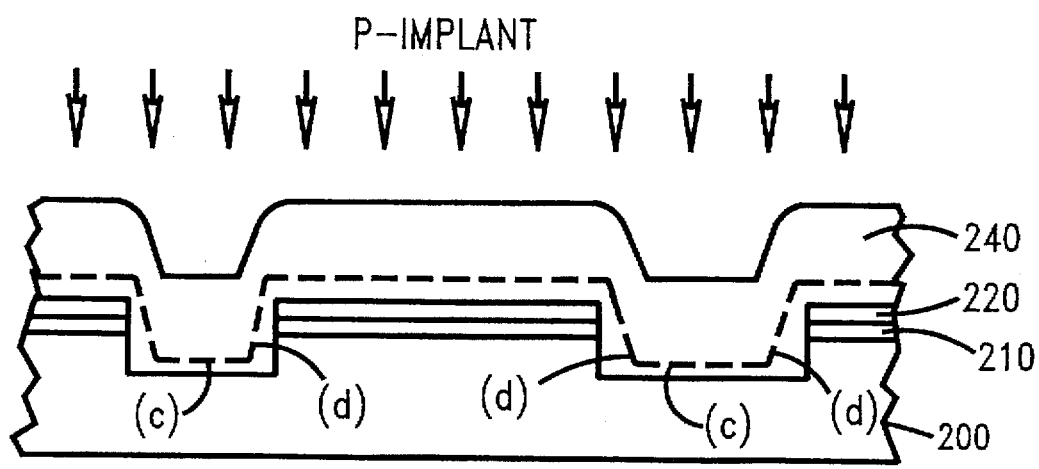
Figure 5C:
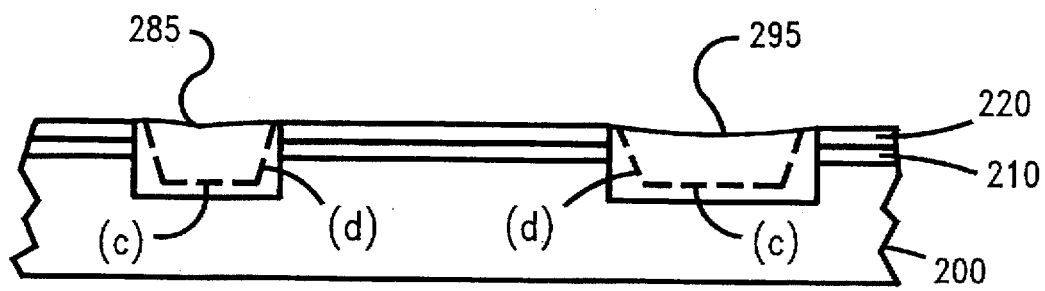

An alternate process sequence as shown in FIGS. 5A–5C can be used in cases where the trench design rules lead to the width of the trenches being more than twice the depth. FIG. 5A shows a substrate 200, with trenches 260' and 270' etched into it. Layers of thermal $SiO_2$ 210 and silicon nitride 220 are blanket deposited prior to etching the trench using a photoresist pattern. $SiO_2$ layer 240 is deposited to slightly overfill the trenches, using any suitable deposition process. Phosphorus ions are implanted into layer 240 in a vertical direction with sufficient energy to form their peak concentration region below the trench surface corresponding to layer 220. The implanted layer region follows the contour of layer 240 and has two distinct parts, a horizontal region (c) and a near vertical region (d) as shown. The concentration of region (c) is approximately determined by implant dose. For 3–5 KA deep trench, using a 3000A fill, P dose of 1–5E15/cm2 can be used using 100–110 KeV. With 5000A fill, one can use 70–150 KeV. The phosphorus concentration of region (d) is approximately given by the product of concentration (c) and the cosine of the step angle. For most conformal deposition, the concentration of (d) region is a very small fraction of the concentration of (c) region. By suitable planarization process, such as chemical mechanical polish, sacrificial layer etch back or combination of processes, the $SiO_2$ layer outside the trench is removed resulting in a structure such as shown in FIG. 5C. Thus an STI structure with a planar surface 285, 295 with a buried P layer has been achieved in a self aligned manner, without the concern of creating steps or depressions in the STI from subsequent processes.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A semiconductor device comprising:
   substrate having a surface;
   a plurality of trenches, extending from the surface into the substrate, having a sidewall and a bottom surface;
   said trenches filled with a silicon dioxide body, said silicon dioxide body in contact with said sidewall and bottom surface; and,
   said silicon dioxide body having a phosphorus dopant region, wherein said phosphorus dopant region is predominantly buried within the silicon dioxide body.

2. The semiconductor device of claim 1, wherein said phosphorus dopant region in said silicon dioxide body has a first region adjacent to the sidewall and a second region adjacent to the bottom surface of the trench.

3. The semiconductor device of claim 2, wherein said phosphorus dopant region has a phosphorus concentration larger in the second region adjacent to the bottom surface than in the first region adjacent to the sidewall.

4. The semiconductor device of claim 1, wherein said phosphorus dopant region is formed by implantation.

5. The semiconductor device of claim 1, wherein said phosphorus dopant region has a concentration of at least 2 weight percent of Phosphorus.

* * * * *

UNITED STATES PATENT AND TRADEMARK OFFICE
Certificate

Patent No. 5,729,043                           Patented: March 17, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Joseph F. Shepard and Paul A. Ronsheim.

Signed and Sealed this First Day of December, 1998.

BRIAN W. BROWN
*Special Programs Examiner*
Technology Center 2800